US007782932B2

(12) United States Patent
Payne et al.

(10) Patent No.: US 7,782,932 B2
(45) Date of Patent: Aug. 24, 2010

(54) CIRCUIT AND METHOD FOR EVALUATING THE PERFORMANCE OF AN ADAPTIVE DECISION FEEDBACK EQUALIZER-BASED SERIALIZER DESERIALIZER AND SERDES INCORPORATING THE SAME

(75) Inventors: Robert F. Payne, Allen, TX (US); Bhavesh G. Bhakta, Richardson, TX (US)

(73) Assignee: Texas Instruments Incorporated, Dallas, TX (US)

( * ) Notice: Subject to any disclaimer, the term of this patent is extended or adjusted under 35 U.S.C. 154(b) by 889 days.

(21) Appl. No.: 10/831,502

(22) Filed: Apr. 23, 2004

(65) Prior Publication Data

US 2005/0238093 A1 Oct. 27, 2005

(51) Int. Cl.
*H04Q 1/20* (2006.01)
*H04B 3/46* (2006.01)
*H04B 17/00* (2006.01)

(52) U.S. Cl. .................. 375/224; 375/226; 375/229; 375/232; 375/326

(58) Field of Classification Search ............... 375/224, 375/226, 229, 232, 326
See application file for complete search history.

(56) References Cited

U.S. PATENT DOCUMENTS 6,233,273 B1* 5/2001 Webster et al. ............. 375/148
6,570,406 B2 5/2003 Tang et al.
2002/0085656 A1* 7/2002 Lee et al. .................... 375/355
2003/0142740 A1 7/2003 Haunstein et al.
2004/0234014 A1* 11/2004 Chen .......................... 375/350

OTHER PUBLICATIONS

Smalley; Equalization Concepts: A Tutorial; Texas Instruments Incorporated; SPRA 140, Oct. 1994; pp. 1-28.
MSAN-127, 2B1Q Line Code Tutorial; Zarlink Semiconductor; Issue 2, Mar. 1990; pp. 1-5.
Austin; Decision-Feedback Equalization for Digital Communication Over Dispersive Channels; MIT Lincoln Laboratory, Technical Report No. 437; Aug. 1967; pp. 1-94.

* cited by examiner

*Primary Examiner*—Ted M Wang
(74) *Attorney, Agent, or Firm*—John J. Patti; Wade J. Brady, III; Frederick J. Telecky, Jr.

(57) ABSTRACT

A circuit and method for evaluating serializer deserializer (SERDES) performance that is particularly advantageous when the SERDES has a decision feedback equalizer (DFE). In one embodiment, the circuit has a data processing path and an operational feedback loop coupled to said data processing path and containing an equalizer, perhaps a DFE. In that embodiment, the circuit includes an eye scanning circuit coupled to said data processing path but separate from said equalizer and configured to measure at least one dimension of an eye relative to which said equalizer is configured for operation without substantially affecting said operation.

14 Claims, 3 Drawing Sheets

US 7,782,932 B2

CIRCUIT AND METHOD FOR EVALUATING THE PERFORMANCE OF AN ADAPTIVE DECISION FEEDBACK EQUALIZER-BASED SERIALIZER DESERIALIZER AND SERDES INCORPORATING THE SAME

TECHNICAL FIELD

The present invention is directed, in general, to data communications and, more specifically, to a circuit and method for evaluating the performance of an adaptive decision feedback equalizer (DFE)-based serializer/deserializer (SERDES).

BACKGROUND

High speed serial links operating at over 3 gigabits per second (Gbs) over distances in excess of several feet using only copper traces on conventional FR-4 dielectric printed circuit board (PCB) electrical backplanes have become commonplace. In fact, transceivers operating at rates in excess of 6 Gbs over similar PCB-based serial links are now becoming available in the marketplace. It is expected that rates of 10 Gbs will soon be introduced.

Such serial links commonly employ a serializer/deserializer (SERDES) at each end for multiplexing and demultiplexing multiple, M-ary pulse amplitude modulated (M-PAM) non-return-to-zero (NRZ) high speed data streams. As the bit rates (and concomitant frequencies) have escalated over time, system designers have had to contend with the difficulty of communicating over these increasingly dispersive links without sacrificing system performance. As bit rates increase, intersymbol interference (ISI) and noise caused by crosstalk from other signals on the PCB increases. The signal-to-noise ratio (SNR) decreases due to the ISI and the noise to the point that discerning the boundary between adjacent received symbols at the receiver end becomes quite difficult. As a result, recovering a clock signal may become difficult, and bit error rates (BER) may rise to an unacceptable level as a result.

An oscilloscope trace of the serial link at the receiver end reveals overlapping, phase-shifted M-PAM NRZ waveforms with intermittent gaps, colloquially called "data eyes," between the waveforms. The dimensions of each data eye, both horizontal (time) and vertical (voltage), diminish as dispersion increases and collapse at the extreme. To recover clock and data signals from the symbols correctly, the SERDES should accurately track the waveforms in terms of both time and voltage. The best opportunity to do this occurs by operating in the center of data eye, where adjacent symbols are best discriminated from one another.

The current trend in SERDES design is to gravitate toward techniques more commonly encountered in digital communications system design: increased reliance on signal processing and statistical system characterization. One of the more prominent examples of this design philosophy is evident in the application of channel equalization to combat the increased frequency selectivity of the channel. Proper channel equalization maximizes the effective dimensions of the data eye, affording the SERDES the best chance of interpreting symbols correctly.

It is important to determine that new SERDES designs and systems incorporating such SERDES designs are working optimally. Proper equalizer performance evaluation dictates that both the horizontal and vertical dimensions of the recovered data eye be measured and compared against expected operating conditions, including the recovered clock location in the data eye and the voltage sensitivity of the receiver. Misequalization problems can thus be corrected before the designs are put into production. In addition, SERDES and system margins can be measured during operation.

The typical technique for evaluating the performance of a SERDES is to scan the data eye to find its boundaries by varying the offset voltage and clock signal phase at which the SERDES is sampling the incoming waveforms. The boundary of the data eye is encountered when the BER rises to a threshold level. Unfortunately, this technique is of no use whatsoever if a SERDES is equipped with an equalizer that is a decision feedback equalizer (DFE).

The DFE (see, Austin, "Decision-Feedback Equalization for Digital Communication Over Dispersive Channels," MIT Lincoln Laboratory, Tech. Report No. 437, August 1967, incorporated herein by reference) has become very popular in communications system design due to its effectiveness under a wide variety of channel types. The DFE is a nonlinear equalizer and is especially effective on channels with severe dispersion, because it can correct for channel imperfections without displaying the excessive noise enhancement of a linear equalizer. A DFE has a precursor (or feedforward) equalizer and a postcursor (or feedback) equalizer. The precursor equalizer is a linear transversal filter, the purpose of which is to cancel precursor ISI. The precursor equalizer does this by filtering the channel output, attempting to relocate most of the channel precursor energy to the postcursor response of the filtered output.

The postcursor equalizer is strictly causal. The postcursor equalizer uses past decisions to cancel the remaining postcursor ISI from the current decision variable. Unfortunately, because the postcursor equalizer bases subsequent decisions on earlier decisions, the varying of offset voltage and clock signal phase that occurs when scanning the data eye confuses the DFE; an incorrect symbol decision degrades subsequent symbols. The result is an inaccurate assessment of the SERDES's performance. In addition, the timing of the feedback decisions is critical in a DFE, especially at high data rates. This prevents the arbitrary movement of the clock position within the data eye.

What is needed in the art is a more generally applicable way to test equalizer-based SERDES. More specifically, what is needed in the art is a way to test DFE-based SERDES. Even more specifically, since many SERDES are now embodied in integrated circuits (ICs), what is needed in the art is a way to test DFE-based SERDES ICs with relatively few architectural changes or little additional hardware.

SUMMARY

The present invention is based on the recognition that prior art equalizer performance evaluation techniques are inadequate because they can interfere with the operation of the equalizer, particularly if the equalizer is a DFE. The voltage offset and clock signal phase adjustments required to scan a data eye impair the decision-making ability of the equalizer, altering its performance and rendering the overall performance evaluation suspect. In response, the present invention introduces the broad concept of separating the eye measuring ("scanning") circuitry from the equalizer so the former does not interfere with the latter.

In one aspect, the present invention provides a circuit for evaluating the performance of a SERDES, particularly one that has a DFE. In one embodiment, the circuit has a data processing path and an operational feedback loop coupled to the data processing path and containing the equalizer. In that embodiment, the circuit includes an eye scanning circuit coupled to the data processing path but separate from the equalizer and configured to measure at least one dimension of a data eye relative to which the equalizer is configured for operation without substantially affecting the operation.

In another aspect, the present invention provides a method of evaluating the performance of a SERDES. In one embodiment, the method includes: (1) measuring, with an eye scanning circuit coupled to the data processing path but separate from the equalizer, at least one dimension of a data eye relative to which the equalizer is configured for operation without substantially affecting the operation and (2) evaluating the performance based on the at least one dimension.

In yet another aspect, the present invention provides a SERDES incorporating the system for evaluating the SERDES's performance. In one embodiment, the SERDES includes: (1) a transmitter portion, and a receiver portion associated with the transmitter portion. The receiver portion has (1) a data processing path having a phase-locked loop (PLL) and a serial to parallel converter associated with the PLL, (2) an operational feedback loop coupled to the data processing path and containing a DFE and (3) a circuit for evaluating equalizer performance having an eye scanning circuit coupled to the data processing path but separate from the equalizer and configured to measure at least one dimension of a data eye relative to which the DFE is configured for operation without substantially affecting the operation.

The foregoing has outlined preferred and alternative features of the present invention so that those skilled in the art may better understand the detailed description of the invention that follows. Additional features of the invention will be described hereinafter that form the subject of the claims of the invention. Those skilled in the art should appreciate that they can readily use the disclosed conception and specific embodiment as a basis for designing or modifying other structures for carrying out the same purposes of the present invention. Those skilled in the art should also realize that such equivalent constructions do not depart from the spirit and scope of the invention.

BRIEF DESCRIPTION OF THE DRAWINGS

For a more complete understanding of the present invention, reference is now made to the following descriptions taken in conjunction with the accompanying drawings, in which.

DETAILED DESCRIPTION

Figure 1:
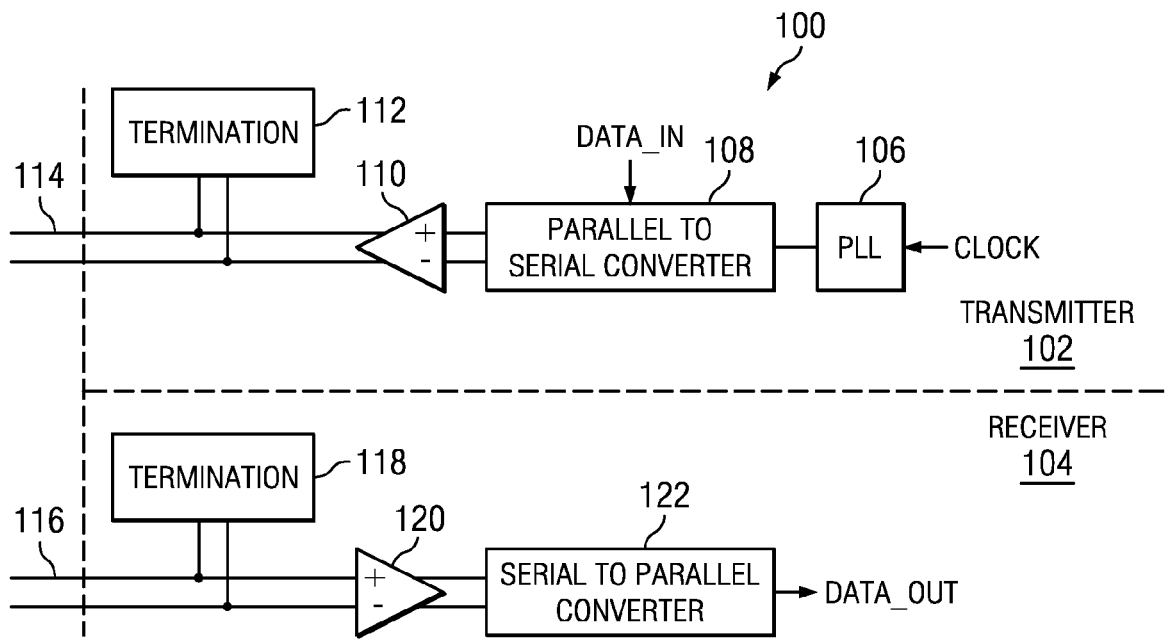
FIG. 1 illustrates a block diagram of a SERDES in accordance with a preferred embodiment of the present invention.

Refer now to the drawings wherein depicted elements are, for the sake of clarity, not necessarily shown to scale and wherein like or similar elements are designated by the same reference numeral through the several views.

Referring initially to FIG. 1, a block diagram of a SERDES 100 incorporating an adaptive DFE is shown. The SERDES 100 includes a transmitter 102 and a receiver 104. The transmitter 102 generally comprises a phase-locked loop (PLL) 106, a serializer or parallel-to-series converter 122, an output amplifier 110, an a termination 112. The receiver 104 generally comprises a termination 118, an isolation amplifier 120, and a parallelizer or serial-to-parallel converter 122.

In operation, the transmitter 102 receive input data DATA_IN and transmits data across serial link 114. The PLL 106 receives and stabilizes a clock signal CLOCK (and possibly generates a higher frequency clock signal from CLOCK). The parallel-to-serial converter 108 receives parallel input data DATA_IN and the stabilized clock signal from the PLL 106. The parallel-to-serial converter 108 converts the parallel data operating at a relatively low bit rate to a serial bit stream operating at a higher bit rate. For example, if the parallel data is N bits wide at data rate R, the serial data resulting from conversion will be a single signal operating at a rate N×R. The parallel-to-serial converter 108 provides serial data output to output amplifier 110, which drives a properly terminated (via termination 112) high speed serial link 114 with serial non-return-to-zero (NRZ) data.

In operation, the receiver 104 receive serial NRZ data from serial link 116 and outputs parallel data DATA_OUT. A properly terminated (via termination 118) high speed serial link 116 (which may be the same as the high speed serial link 114) carrying serial NRZ data leads to an isolation amplifier 120. Serial data provided from the isolation amplifier 120 is provided to a serial-to-parallel converter 122. The serial-to-parallel converter 122 is able to recover the clock signal embedded in the serial data and uses it to retrieve the received serial data. Additionally, the serial-to-parallel converter 122 converts the serial data into parallel data DATA_OUT, analogous to the operation of the parallel-to-serial converter 108.

Figure 2:
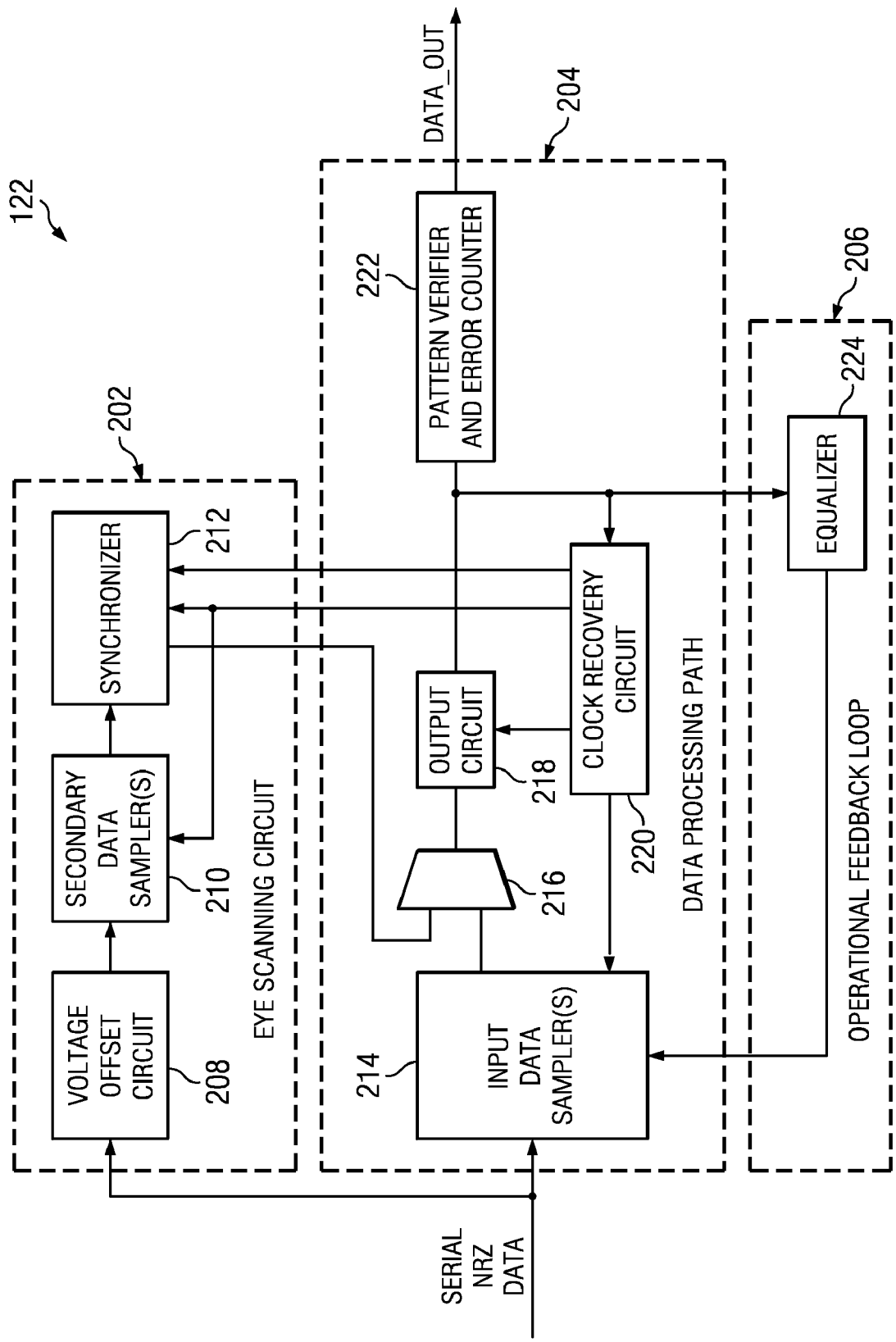
FIGS. 2 and 3 are block diagrams of the serial-to-parallel converter of FIG. 1.

Turning now to FIG. 2, a more diagram of the serial-to-parallel converter 122 of FIG. 1. The serial-to-parallel converter 122 generally comprises an eye scanning circuit 202, a data processing path 204, and an operational feedback path 206. The eye scanning circuit 202 generally comprises a voltage offset circuit 208, secondary data sampling circuit 210, and synchronizer 212. The data processing path 204 generally comprises an input data sampling circuit 214, a multiplexer 216, an output circuit 218, a clock recovery circuit 220, and a pattern verifier and error counter circuit 222. The operational feedback loop 206 generally comprises an equalizer 224.

In operation, input data sampling circuit 214 samples serial NRZ data SERIAL_NRZ_DATA at instances defined by clock signal edges. The input data sampling circuit 214 provides its output, which now takes the form of a digital data stream, to multiplexer 216. The multiplexer 216 is also coupled to the synchronizer 212, providing an output to the output circuit 218. The clock recovery circuit 220 recovers a clock signal from the digital data stream output from the output circuit 218. The clock signal is used to drive the one or more input data sampling circuit 214 and further to synchronize downstream circuitry (not shown).

As shown, data processing path 204 employs a pattern identifier and error counter circuit 222. The purpose of the pattern identifier and error counter circuit 222 is to evaluate the recovery of test patterns by determining the BER during testing. Typically, the pattern identifier and error counter circuit 220 attempts to recognize valid test patterns in the digital data stream from the output circuit 218. Here, for example, these patterns are used for system and device-level testing.

Looking now to the operational feedback loop 206, the operational feedback loop 206 is coupled to the data processing path 204 and includes an equalizer 224 (which can be a DFE). The equalizer 224 receives the digital data stream and produces from it a signal that is fed back and combined with the serial NRZ data to improve its quality and BER.

As described above, it is important to verify that the SERDES is operating within the eye of the serial NRZ data and to determine voltage and timing margins. Verifying SERDES operation means scanning the data eye to determine its dimensions. Unfortunately, scanning the data eye can cause the equalizer 224 to malfunction, artificially increasing BER. This is because prior art eye scanning circuitry was integrated into the operational feedback loop 206 and therefore interfered with its operation. However, the serial-to-parallel converter 122 uses an eye scanning circuit 202 to address these problems. The eye scanning circuit 202 is coupled to the data processing path 204 but is separate from at least the equalizer 224 (and, as illustrated, the entire operational feedback loop 206). The eye scanning circuit 202 is configured to measure at least one dimension of a data eye relative to which the equalizer 224 is configured for operation. This, it does without substantially affecting the operation of equalizer 224.

In operation, eye scanning circuit 202 includes secondary data sampling circuit 210 to convert the serial NRZ data into a secondary digital data stream, which does not affect the operation of the input data sampling circuit 214 output of circuit 214 does not interact with the digital data stream produced by the input data sampling circuit 214. The digital data stream is received by the multiplexer 216, which allows the secondary digital data stream to be pattern-verified and error-counted in the pattern verifier and error counter circuit 222. Additionally, a synchronizer 212 affect horizontal data eye scanning, while voltage offset circuit 208 applies a controlled offset voltage to the serial NRZ data to bias it before it is delivered to the secondary data sampling circuit 210 so as to shift the serial NRZ data vertically to affecting a vertical scan of the data eye contained in the serial NRZ data.

Moreover, the multiplexer 216 can operate in a number of possible ways. Verification of SERDES performance can occur while the SERDES is operating. To do so, the multiplexer 216 interleaves the digital data stream from the input data sampling circuit 214 with the secondary digital data stream from the secondary data sampling circuit 210. The pattern verifier and error counter circuit 222 verifies patterns and counts errors contained in the secondary digital data stream advantageously but not necessarily reusing the circuits that normally validate the primary data path.

In an alternative embodiment, the SERDES is provided with a test mode that is separate from an operational mode. In the operational mode, the multiplexer 216 is set to deliver only the digital data stream from the input data sampling circuit 214 to the pattern verifier and error counter circuit 222. In the test mode, the multiplexer 216 is set to deliver only the secondary digital data stream from the secondary data sampling circuit 210 to the pattern verifier and error counter circuit 222.

Irrespective of whether verification occurs during operation or during a separate test mode, the BER, which is provided by the pattern verifier and error counter circuit 222, is used to ascertain the dimensions of the data eye. Once the dimensions are determined, the operating point and effectiveness of the DFE and the SERDES (in terms of voltage offset, clock signal phase or both) can be compared and judged to be acceptable or not. Those skilled in the art are familiar with the standards applied to SERDES operation and validation.

Figure 3:
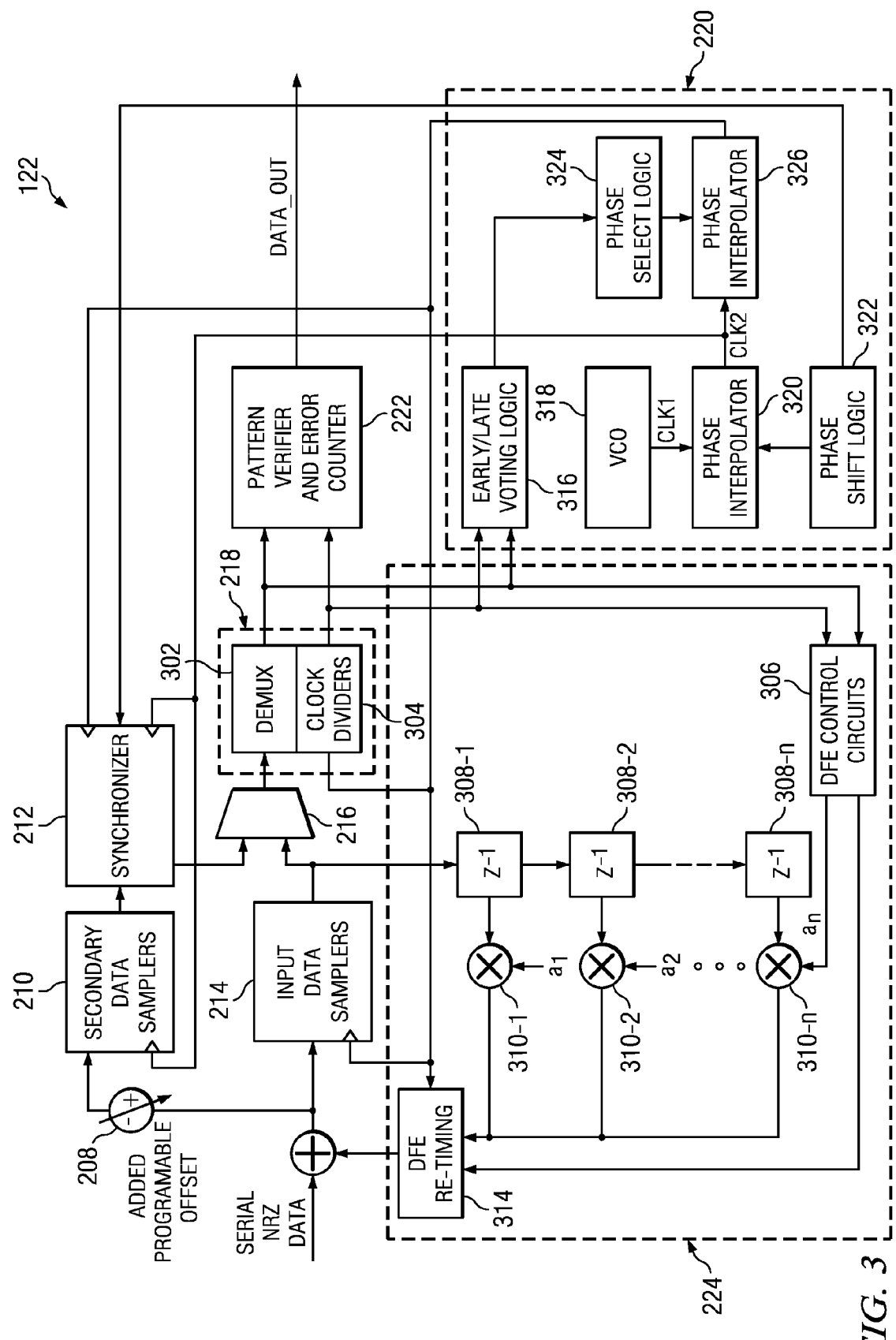

Turning now to FIG. 3, a more detailed diagram of the serial-to-parallel converter 122 circuit of FIG. 2 can be seen. Generally, the converter 122 of FIG. 3 is employed when the SERDES 100 takes the form of an IC, because it uses hardware blocks that are already present in the SERDES for the purpose of verifying the SERDES's operation. Here, the equalizer 224 is shown having separate delay blocks 308-1 to 308-n that are coupled in series with one another, filter coefficients ($a_1, a_2, \ldots, a_n$), multipliers 310-1 to 310-n, and DFE control circuit 306. The output circuit 218 is also shown as including a demultiplexer 302 and clock divider circuit 304. Additionally, the clock recovery circuit 220 is shown as including early/late voting logic or circuit 316, an oscillator (which generally comprises voltage controlled oscillator (VCO) 318, phase interpolators 320 and 326, and phase select logic 324), and phase shift logic 322.

In operation, VCO 318 provides an initial clock signal CLK1 to an intermediate phase interpolator 320, which shifts the phase of the initial clock signal CLK1 to produce a second clock signal CLK2. The intermediate phase interpolator 320 also can generate clock signal CLK2 with arbitrary delays with respect to clock signal CLK1 (which is output from VCO 318) to either advance or retard the phase of clock signal CLK2. Clock signal CLK2 is provided to the secondary data sampling circuit 210 and a synchronizer 212 to effect horizontal data eye scanning, and clock signal CLK2 is provided to phase interpolator 326 to be used in the clock and data recovery loop.

Clock divider circuit 304 and a demultiplexer 312 (which are part of the output circuit 218) provide candidate control signals to early/late voting logic 316. The early/late voting logic 316 provides a winning control signal to phase select logic or circuit 324, which drives phase interpolator 326 so as to align the clock signals used in the input data sampling circuit 214 with respect to the serial NRZ data.

To illustrate to operation of circuit 220, one can assume, for example, that phase interpolator 320 advances its output phase by t picoseconds (ps). Clock signal CLK2 is then shifted by t ps further into the data eye and shifts the recovered clock signal(s) also by t ps. However, the clock and data recovery loop will recognize that the recovered clock signal(s) are now late in the data eye (assuming the loop was initially locked to the center) and will act to retard the recovered clock signal back into the center position by t ps. The impact of the phase shift of clock signal CLK2 on the equalized data eye and data recovery is null since the input data sampling clock signals are all derived from the recovered clock signal. The net effect is a shift in the phase of clock signal CLK2 relative to the recovered, equalized data eye, providing the ability to scan the data eye horizontally. Ultimately, clock signal CLK1 is provided to a DFE re-timing circuit 318. Additionally, the vertical data eye measurement is provided by the voltage offset circuit 208, which includes an amplifier (not shown) with a programmable offset and a sense amplifier (not shown) that is used as a sampling element.

Figure 4:
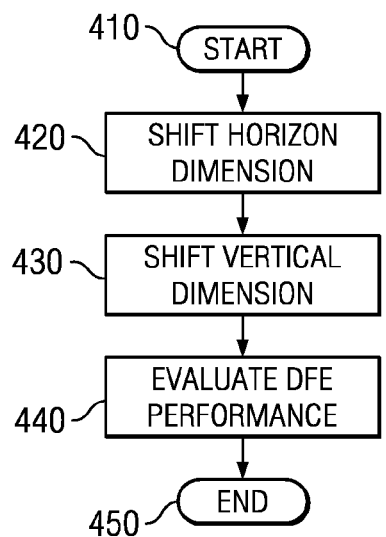
FIG. 4 illustrates a flow diagram of a method of evaluating the performance of a SERDES carried out according to the principles of the present invention.

Turning now to FIG. 4, illustrated is flow diagram of a method of evaluating the performance of a SERDES carried out according to the principles of the present invention. The method begins in a start step 410 when evaluation of the operation of a SERDES is to be undertaken.

The method proceeds to a step 420 in which an eye scanning circuit that is coupled to the SERDES's data processing path but is separate from the SERDES's equalizer measures, by virtue of phase-shifting, a horizontal dimension of a data eye relative to which the equalizer is configured for operation without substantially affecting the operation of the equalizer. The method proceeds to a step 430 in which the eye scanning circuit measures, by virtue of voltage offset-shifting, a vertical dimension of the data eye, again without substantially affecting the operation of the equalizer. In a step 440, the performance of the SERDES is evaluated based on the at least one dimension (both dimensions in the exemplary method of FIG. 4).

Having thus described the present invention by reference to certain of its preferred embodiments, it is noted that the embodiments disclosed are illustrative rather than limiting in nature and that a wide range of variations, modifications, changes, and substitutions are contemplated in the foregoing disclosure and, in some instances, some features of the present invention may be employed without a corresponding use of the other features. Accordingly, it is appropriate that the appended claims be construed broadly and in a manner consistent with the scope of the invention.

What is claimed is:

1. An apparatus comprising:
   a data processing path that is adapted to receive serial non-return zero (NRZ) data, wherein the data processing path includes a multiplexer and a clock recovery circuit;
   an operational feedback loop that is coupled to the data processing path; and
   a eye scanning circuit that includes:
      a voltage offset circuit that is adapted to receive the serial NRZ data;
      a data sampling circuit that is coupled to the voltage offset circuit and the Clock recovery circuit; and
      a synchronizer that is coupled to the data sampling circuit, the clock recovery circuit, and the multiplexer.

2. The apparatus of claim 1, wherein the data sampling circuit further comprises a secondary data sampling circuit, and wherein the data processing path further comprises:
   an adder that is coupled to the operation feedback loop and that is adapted to receive the serial NRZ data;
   an input data sampling circuit that is coupled to the adder and the multiplexer;
   an output circuit that is coupled to the multiplexer, the operational feedback loop, and the clock recovery circuit; and
   a pattern verifier and error circuit counter that is coupled the clock divider circuit and the demultiplexer.

3. The apparatus of claim 2, wherein the output circuit further comprises:
   a demultiplexer that is coupled the multiplexer and the operational feedback loop; and
   a clock divider circuit that is coupled to the Clock recovery circuit and the operational feedback loop.

4. The apparatus of claim 3, wherein the clock recovery circuit further comprises:
   an early/late voting circuit that is coupled to the demultiplexer and the clock divider circuit;
   an oscillator that is coupled to the secondary data sampler, the synchronizer, and the early/late voting logic; and
   phase shift logic that is coupled to the synchronizer and the oscillator.

5. The apparatus of claim 4, wherein the oscillator further comprises:
   a voltage controlled oscillator (VCO);
   a first phase interpolator that is coupled to the VCO and the phase shift logic;
   second phase interpolator that is coupled to the first phase interpolator and the operational feedback loop; and
   phase select logic that is coupled to the early/late voting logic and the second phase interpolator.

6. The apparatus of claim 5, wherein the operational feedback loop further comprises an equalizer.

7. The apparatus of claim 6, wherein the equalizer further comprises:
   a control circuit that is coupled to the demultiplexer and the clock divider circuit;
   a plurality of delay elements that are coupled in series with one another, and wherein at least one of the delay elements is coupled to the input data sampling circuit;
   a plurality of multipliers, wherein each multiplier is coupled to at least one of the delay elements, and wherein each multiplier is coupled to control circuit so as to receive at least one of a plurality of filter coefficients; and
   a retiming circuit that is coupled to the control circuit and each of the multipliers.

8. An apparatus comprising:
   a transmitter that is adapted to be coupled to a serial link; and
   a receiver that is adapted to be coupled to the serial link, wherein the receiver includes:
      a data processing path that is adapted to receive serial non-return zero (NRZ) data, wherein the data processing path includes a multiplexer and a clock recovery circuit;
      an operational feedback loop that is coupled to the data processing path; and
      a eye scanning circuit that includes:
         a voltage offset circuit that is adapted to receive the serial NRZ data;
         a data sampling circuit that is coupled to the voltage offset circuit and the Clock recovery circuit; and
         a synchronizer that is coupled to the data sampling circuit, the clock recovery circuit, and the multiplexer.

9. The apparatus of claim 8, wherein the data sampling circuit further comprises a secondary data sampling circuit, and wherein the data processing path further comprises:
   an adder that is coupled to the operation feedback loop and that is adapted to receive the serial NRZ data;
   an input data sampling circuit that is coupled to the adder and the multiplexer;
   an output circuit that is coupled to the multiplexer, the operational feedback loop, and the clock recovery circuit; and
   a pattern verifier and error circuit counter that is coupled the clock divider circuit and the demultiplexer.

10. The apparatus of claim 9, wherein the output circuit further comprises:
    a demultiplexer that is coupled the multiplexer and the operational feedback loop; and
    a clock divider circuit that is coupled to the Clock recovery circuit and the operational feedback loop.

11. The apparatus of claim 10, wherein the clock recovery circuit further comprises:
    an early/late voting circuit that is coupled to the demultiplexer and the clock divider circuit;
    an oscillator that is coupled to the secondary data sampler, the synchronizer, and the early/late voting logic; and
    phase shift logic that is coupled to the synchronizer and the oscillator.

12. The apparatus of claim 11, wherein the oscillator further comprises:
    a voltage controlled oscillator (VCO);
    a first phase interpolator that is coupled to the VCO and the phase shift logic;
    second phase interpolator that is coupled to the first phase interpolator and the operational feedback loop; and
    phase select logic that is coupled to the early/late voting logic and the second phase interpolator.

13. The apparatus of claim 12, wherein the operational feedback loop further comprises an equalizer.

14. The apparatus of claim 13, wherein the equalizer further comprises:
    a control circuit that is coupled to the demultiplexer and the clock divider circuit;

a plurality of delay elements that are coupled in series with one another, and wherein at least one of the delay elements is coupled to the input data sampling circuit;

a plurality of multipliers, wherein each multiplier is coupled to at least one of the delay elements, and wherein each multiplier is coupled to control circuit so as to receive at least one of a plurality of filter coefficients; and a retiming circuit that is coupled to the control circuit and each of the multipliers.

* * * * *